United States Patent
Otremba et al.

(10) Patent No.: US 9,754,862 B2
(45) Date of Patent: Sep. 5, 2017

(54) COMPOUND SEMICONDUCTOR DEVICE INCLUDING A MULTILEVEL CARRIER

(71) Applicant: Infineon Technologies Austria AG, Villach (AT)

(72) Inventors: Ralf Otremba, Kaufbeuren (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 20 days.

(21) Appl. No.: 15/085,622

(22) Filed: Mar. 30, 2016

(65) Prior Publication Data
US 2016/0293543 A1   Oct. 6, 2016

(30) Foreign Application Priority Data
Mar. 31, 2015   (DE) .................. 10 2015 104 995

(51) Int. Cl.
*H01L 23/495*   (2006.01)
*H01L 23/48*    (2006.01)
(Continued)

(52) U.S. Cl.
CPC .. *H01L 23/49503* (2013.01); *H01L 23/49551* (2013.01); *H01L 23/49562* (2013.01);
(Continued)

(58) Field of Classification Search
CPC ..... H01L 23/42; H01L 23/4334; H01L 33/64; H01L 23/345; H01L 23/373;
(Continued)

(56) References Cited

U.S. PATENT DOCUMENTS 6,255,722 B1   7/2001   Ewer et al.
6,313,520 B1 * 11/2001   Yoshida ............ H01L 23/49575
                                                      257/666
(Continued)

FOREIGN PATENT DOCUMENTS

DE        10301091 A1      7/2004
DE     102008027703 A1     1/2009
(Continued)

OTHER PUBLICATIONS

"60A Integrated PowIRstage", IR3550, Final Datasheet, International Rectifier, Mar. 12, 2012, pp. 1-22.
(Continued)

*Primary Examiner* — Mary Wilczewski
*Assistant Examiner* — Tsz Chiu
(74) *Attorney, Agent, or Firm* — Murphy, Bilak & Homiller, PLLC

(57) ABSTRACT

A device includes a carrier having a first carrier section on a first level and a second carrier section on a second level different from the first level. The device further includes a compound semiconductor chip arranged over the first carrier section and a control semiconductor chip arranged over the second carrier section. The control semiconductor chip is configured to control the compound semiconductor chip. An encapsulation material covers the compound semiconductor chip and the control semiconductor chip.

19 Claims, 6 Drawing Sheets

(51) Int. Cl.
*H01L 25/16* (2006.01)
*H01L 23/31* (2006.01)
*H01L 23/36* (2006.01)

(52) U.S. Cl.
CPC .... *H01L 23/49575* (2013.01); *H01L 23/3107* (2013.01); *H01L 23/36* (2013.01); *H01L 2224/48091* (2013.01); *H01L 2224/48111* (2013.01); *H01L 2224/48137* (2013.01); *H01L 2224/48247* (2013.01); *H01L 2224/4903* (2013.01); *H01L 2924/181* (2013.01)

(58) Field of Classification Search
CPC ......... H01L 23/49568; H01L 23/49575; H01L 23/498; H01L 23/13
See application file for complete search history.

(56) References Cited

U.S. PATENT DOCUMENTS

| | | | |
|---|---|---|---|
| 6,432,750 B2 | 8/2002 | Jeon et al. | |
| 6,621,155 B1* | 9/2003 | Perino | H01L 23/3128 174/538 |
| 6,677,669 B2 | 1/2004 | Standing | |
| 6,946,740 B2 | 9/2005 | Schaffer | |
| 7,061,080 B2* | 6/2006 | Jeun | H01L 21/565 257/666 |
| 7,208,818 B2 | 4/2007 | Luo et al. | |
| 7,285,849 B2 | 10/2007 | Cruz et al. | |
| 7,800,208 B2 | 9/2010 | Otremba | |
| 7,804,131 B2 | 9/2010 | Cheah et al. | |
| 7,851,908 B2 | 12/2010 | Otremba et al. | |
| 7,944,044 B2 | 5/2011 | Carney et al. | |
| 8,193,618 B2 | 6/2012 | Madrid | |
| 8,471,373 B2* | 6/2013 | Minamio et al. | H01L 21/565 257/676 |
| 8,685,792 B2* | 4/2014 | Chow | H01L 25/03 257/678 |
| 8,896,130 B2* | 11/2014 | Liu | H01L 24/32 257/777 |
| 9,041,170 B2 | 5/2015 | Otremba et al. | |
| 2004/0145039 A1* | 7/2004 | Shim | H01L 25/0657 257/678 |
| 2008/0023825 A1 | 1/2008 | Hebert et al. | |
| 2008/0224323 A1 | 9/2008 | Otremba et al. | |
| 2010/0148327 A1 | 6/2010 | Madrid | |
| 2012/0292753 A1 | 11/2012 | Cho | |
| 2012/0299119 A1 | 11/2012 | Xue et al. | |

FOREIGN PATENT DOCUMENTS

| | | |
|---|---|---|
| DE | 102008051965 A1 | 7/2009 |
| DE | 102010000199 A1 | 1/2011 |
| EP | 1143514 B1 | 4/2009 |

OTHER PUBLICATIONS

"Complete Current Share 10A DC/DC Power Module", ISL8200AM, FN8271.4, Intersil Americas, LLC, Mar. 7, 2013, pp. 1-24.

"High Performance DrMOS", TDA21220, Data Sheet Revision 1.9, Infineon Technologies AG, Mar. 31, 2011, pp. 1-26.

* cited by examiner

COMPOUND SEMICONDUCTOR DEVICE INCLUDING A MULTILEVEL CARRIER

TECHNICAL FIELD

The disclosure relates, in general, to semiconductor devices. More particular, the disclosure relates to devices including a compound semiconductor material and a carrier having multiple levels.

BACKGROUND

Semiconductor devices may include multiple semiconductor chips that may be arranged in separated packages. The separated packages may need to be electrically coupled in order to establish a communication between the included semiconductor chips. During an operation of the semiconductor devices undesired effects, such as e.g. parasitic inductances, may occur inside and outside of the semiconductor devices. Semiconductor devices constantly have to be improved. In particular, it may be desirable to reduce undesired effects that may occur during an operation of the devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

Figure 1A:
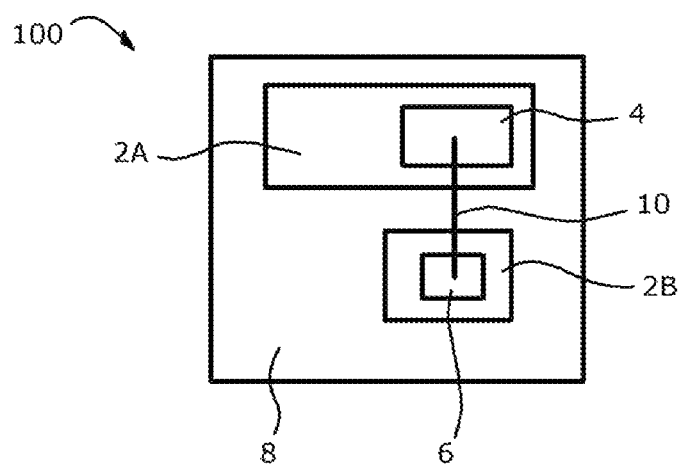
FIG. 1A schematically illustrates a top view of a device 100 in accordance with the disclosure.

In the following detailed description, reference is made to the accompanying drawings, which form a part hereof, and in which is shown by way of illustration specific aspects in which the disclosure may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value depending on tolerances that may typically occur when applying techniques for fabricating a housing made of the encapsulation material.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips that may be of different types and may be manufactured by different technologies. In general, semiconductor chips may include integrated electrical, electro-optical or electro-mechanical circuits, passives, etc. In addition, the integrated circuits may be designed as logic integrated circuits, analog integrated circuits, mixed signal integrated circuits, power integrated circuits, memory circuits, integrated passives, microelectromechanical systems, etc.

The semiconductor chips need not be manufactured from a specific semiconductor material and may contain inorganic and/or organic materials that are not semiconductors, such as, for example, insulators, plastics or metals. In one example, the semiconductor chips may be made of or may include an elemental semiconductor material, for example Si, etc. In a further example, the semiconductor chips may be made of or may include a compound semiconductor material, for example GaN, SiC, SiGe, GaAs, etc. In particular, the devices described herein may include one or more compound semiconductor chips based on a compound semiconductor material.

The semiconductor chips may include one or more power semiconductors. In general, the power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc. In particular, the power semiconductor chips may be based on one or more of the compound semiconductor materials specified above. Devices in accordance with the disclosure are not restricted to include a specific type of power semiconductor chip. Comments made in connection with a specific type of power semiconductor chip may thus be likewise applied to further types of power semiconductor chips. As such, the terms "power MOSFET", "power HEMT", "MOSFET", "HEMT" may be used synonymously herein, for example.

The semiconductor chips may have a vertical structure, i.e. the semiconductor chips may be fabricated such that electric currents may substantially flow in a direction perpendicular to the main faces of the semiconductor chips. A semiconductor chip having a vertical structure may have electrodes over its two main faces, i.e. over its top side and bottom side. In particular, power semiconductor chips may have a vertical structure and may have load electrodes arranged over both main faces. For example, the source electrode and gate electrode of a power MOSFET may be arranged over one face while the drain electrode of the power MOSFET may be arranged over the other face. In a further example, a power HEMT may be configured as a vertical power semiconductor chip. Yet further examples for a vertical power semiconductor chip are a PMOS (P-Channel Metal Oxide semiconductor), an NMOS (N-Channel Metal Oxide semiconductor), or one of the exemplary power semiconductors specified above.

The semiconductor chips may have a lateral structure, i.e. the semiconductor chips may be fabricated such that electric currents may substantially flow in a direction parallel to a main face of the semiconductor chips. A semiconductor chip having a lateral structure may have electrodes arranged over one of its main faces. In one example, a semiconductor chip having a lateral structure may include an integrated circuit, such as e.g. a logic chip. In a further example, a power semiconductor chip may have a lateral structure, wherein the load electrodes may be arranged over one main face of the chip. For example, the source electrode, the gate electrode and the drain electrode of a power MOSFET may be arranged over one main face of the power MOSFET. A further example of a lateral power semiconductor chip may be a HEMT (High Electron Mobility Transistor) that may be fabricated from one or more of the above mentioned compound semiconductor materials.

The devices described herein may include one or more control semiconductor chips (or control integrated circuits) configured to control and/or drive electronic components of the device. For example, a control semiconductor chip may be configured to control and/or drive the integrated circuits of one or more power semiconductor chips. In this regard, the terms "control semiconductor chip" and "driver semiconductor chip" may be used synonymously.

A driver circuit may be configured to drive one or more electronic components, for example a high-power transistor that may be included in the device. The driven components may be voltage driven or current driven. For example, Power MOSFETs, IGBTs, etc., may be voltage driven switches, since their insulated gate may particularly behave like a capacitor. Conversely, switches such as triacs (triode for alternating current), thyristors, bipolar transistors, a PN diode, etc., may be current driven. In one example, driving a component including a gate electrode may include applying different voltages to the gate electrode, e.g. in form of turn-on and turn-off switching wave forms. In a further example, a driver circuit may be used to drive a direct driven circuit. A control circuit may be configured to control one or more drivers driving components of the device. In one example, a control circuit may simultaneously control drivers of multiple direct driven circuits. For example, a half bridge circuit including two direct driven circuits may thus be controlled by a controller.

The semiconductor chips may include an arbitrary number of electrical contacts. In one example, the electrical contacts may be arranged over the frontside and the backside of the semiconductor chip. Such semiconductor chip may e.g. correspond to a power semiconductor chip that may include a drain contact arranged on one side of the semiconductor chip, as well as a source contact and a gate contact arranged over the opposite side of the semiconductor chip. In a further example, the electrical contacts may be exclusively arranged over the frontside of the semiconductor chip. For example, such semiconductor chip may be referred to as lateral chip and may e.g. correspond to a discrete semiconductor chip. An electrical contact may have the form of a contact pad (or a contact element or a contact terminal or a contact electrode) that may be fabricated of at least one of a metal and a metal alloy. Any desired metal or metal alloy, for example, aluminum, titanium, gold, silver, copper, palladium, platinum, nickel, chromium, vanadium, tungsten, molybdenum, etc., may be used as a material.

The semiconductor chips may be packaged or unpackaged. In this regard, the terms "semiconductor device" and "semiconductor package" as used in this specification may be interchangeably used. In particular, a semiconductor package may be a semiconductor device including an encapsulation material that may at least partly encapsulate one or more components of the semiconductor device.

The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the device with the encapsulation material, for example at least one of compression molding, injection molding, powder molding, liquid molding, lamination, etc.

The devices described herein may include a carrier over which one or more semiconductor chips may be arranged. In general, the carrier may include one or more carrier sections that may have various purposes. In one example, a carrier section may provide a mounting surface for mounting an electronic component of the device. In this regard, the carrier section may e.g. correspond to a diepad on which a semiconductor chip may be mounted. A level of the device including such carrier section may be referred to as diepad level. In a further example, a carrier section may include one or more electrically conductive terminals (or leads or pins) that may provide an electrical connection between components of the device and to external components. In this regard, the carrier section may e.g. correspond to one or more leads of a leadframe. The leads may e.g. protrude out of an encapsulation material of a semiconductor package and provide an electrical connection to internal components of the semiconductor package. An electrical connection between a lead and a semiconductor chip of the device may be additionally established by an electrically conductive coupling element, such as e.g. a wire or a clip. A level of the device including such carrier section may be referred to as wirebond level. In yet a further general example, a carrier section may be a combination of the described carrier sections.

The carrier sections of a carrier may be arranged on one or more levels that may differ from each other. A carrier having multiple carrier sections arranged on different levels may be referred to as multilevel carrier. In one example, each carrier section of a carrier may be arranged in a plane, wherein the different planes associated with the different carrier sections may be arranged in parallel to each other. For example, diepads of the device may be arranged on the diepad level, electrical terminals coupled to wirebonds may be arranged on the wirebond level, etc. In a multilevel carrier, a distance between a first level and a different second level may lie in a range from about 0.5 millimeter to about 5.0 millimeter, and more particular in any of the subranges included in this specified range.

The devices described herein are not restricted to only include one single carrier, but may also include multiple carriers. In general, a carrier may be manufactured from a metal, an alloy, a dielectric, a plastic, a ceramic, or a combination thereof. The carrier may have a homogeneous structure, but may also provide internal structures like conducting paths with an electric redistribution function. A footprint of the carrier may depend on a number and footprints of semiconductor chips that are to be arranged over the carrier. Examples for carriers may be a diepad, a lead frame including a diepad, or a ceramic substrate including one or more redistribution layers.

The carrier sections of a carrier may at least partly be covered by an encapsulation material of the device. A carrier section may be completely surrounded by an encapsulation material such that there are no surfaces of the carrier section accessible from outside of the encapsulation material. A further carrier section may be at least partly exposed from an encapsulation material such that there may be one or more exposed surfaces. For example, a surface of a diepad may be exposed from an encapsulation material such that a heatsink may be arranged over the exposed surface. Thermal grease may be arranged between the exposed surface of the diepad and the heatsink. During an operation of a corresponding device, heat generated by e.g. a semiconductor chip may be dissipated along a path that may extend from the semiconductor chip to the heatsink. In one example, the diepad may include a hole extending through the diepad, wherein the hole may be exposed from the encapsulation material. In a further example, the part of the diepad including the hole may be covered by the encapsulation material as well, wherein the hole may then also extend through the encapsulation material. The heatsink may be attached to the diepad by a fixing component (e.g. a screw) that may extend through the hole.

In one example, a carrier may include a leadframe that may be of any shape, any size and any material. The leadframe may be structured such that diepads (or chip islands) and leads (or pins) may be formed. During a fabrication of a device, the diepads and the leads may be connected to each other. The diepads and the leads may also be made from one piece. The diepads and the leads may be connected among each other by connection means with the purpose of separating some of the diepads and the leads in the course of the fabrication. Here, separating the diepads and the leads may be carried out by at least one of mechanical sawing, a laser beam, cutting, stamping, milling, etching, and any other appropriate technique. In one example, the leadframe may be a multilevel leadframe having various sections arranged on different levels. For example, the different levels of the leadframe may be implemented by bending the leadframe in a suitable manner before or after the various carrier sections have been formed.

In particular, a leadframe may be electrically conductive. For example, the leadframe may be entirely fabricated from metals and/or metal alloys, in particular at least one of copper, copper alloys, nickel, iron nickel, aluminum, aluminum alloys, steel, stainless steel, and other appropriate materials. The leadframe material may include traces of iron, sulfur, iron nitride, etc. The leadframe may be plated with an electrically conductive material, for example at least one of copper, silver, palladium, gold, nickel, iron nickel, and nickel phosphorus. In this case, the leadframe may be referred to as "pre-plated leadframe". Even though a leadframe may be electrically conductive, an arbitrary selection of diepads of the leadframe may be electrically insulated from each other.

A shape, size and/or material of a leadframe may depend on the semiconductor chip(s) that may be arranged over the leadframe. In one example, a compound semiconductor chip, such as e.g. a GaN chip, may be arranged over the leadframe. In this case, the leadframe may be made of or may include aluminum and/or an aluminum alloy. Such leadframe may have a thickness from about 1 millimeter to about 5 millimeter, more particular from about 1 millimeter to about 2 millimeter. For example, the leadframe may be connected to a heat sink that may be made of a similar material. In a further example, a low voltage semiconductor chip may be arranged over the leadframe. In this case, the leadframe may be made of or may include copper and/or a copper alloy and may further include traces of iron and/or sulfur. Such leadframe may have a thickness from about 0.1 millimeter to about 0.5 millimeter, more particular from about 0.2 millimeter to about 0.3 millimeter.

The devices described herein may include a plurality of leads (or pins) that may e.g. be a part of a leadframe. The plurality of leads may protrude out of an encapsulation material of the device such that an electrical connection between internal components of the device and external components may be established. In one example, the plurality of leads may protrude out of a specific surface of the encapsulation material, wherein the individual leads may be particularly arranged in parallel. The distances between the individual leads may be similar or may differ from each other. In this regard, a distance between two leads may be referred to as lead pitch. In one example, a lead pitch $p_{low}$ between two leads used for low voltage or logic applications may lie in a range from about 1 millimeter to about 3 millimeter, and a lead pitch $p_{high}$ between two leads used for high voltage/high current applications may be about $2 \times p_{low}$. The plurality of leads may be arranged on one or more levels of the leadframe that may differ from each other.

One or more semiconductor chips may be arranged over one or more leads of the plurality of leads. In this regard, a lead may include an enlarged surface, for example located at one of its ends, on which a semiconductor chip may be mounted. In one example, the enlarged surface may be of rectangular shape and may have a surface area that may particularly be larger than a surface area of a main surface of the semiconductor chip. In one example, a length of a side edge of the enlarged portion may lie in a range from about 1 millimeter to about 4 millimeter. A semiconductor chip mounted on a lead may e.g. include a power semiconductor, for example a power diode.

The devices described herein may include one or more electrically conductive elements configured to provide an electrical coupling between components of the devices. For example, the electrically conductive elements may be configured to electrically connect a first semiconductor chip and a second semiconductor chip or to provide an electrical connection between a semiconductor chip and a further component that may be arranged inside or outside of the device.

An electrically conductive element may include one or more contact clips. A contact clip may be made of or may include a material similar to the material of a leadframe described above. The shape of the contact clip is not necessarily limited to a specific size or a specific geometric shape. The contact clip may be fabricated by at least one of stamping, punching, pressing, cutting, sawing, milling, and any other appropriate technique. A contact between the electrically conductive element and a contact pad of a semiconductor chip may be established by any appropriate technique. In one example, the electrically conductive element may be soldered to other components, for example by employing a diffusion soldering process.

An electrically conductive element may include one or more wires, in particular bond wires or bonding wires. A wire may include a metal and/or a metal alloy, in particular gold, aluminum, copper, or one or more of their alloys. In addition, the wire may or may not include a coating. The wire may have a substantially circular cross section such that the term "thickness" of the wire may refer to the diameter of the bond wire. However, it is understood that the wire may also have a cross section of different and arbitrary form. In general, a wire may have a thickness from about 15 micrometer to about 1000 micrometer, and more particular a thickness of about 20 micrometer to about 500 micrometer.

In a first more particular example, the wire may have a thickness smaller than 75 micrometer, for example a thickness from about 50 micrometer to about 75 micrometer. Such wire may particularly include or be made of aluminum. The wire may include further materials, for example up to 1% silicon. For example, such wire may provide an electrical connection between a contact element and a gate electrode of a power semiconductor chip and/or between gate electrodes of two different power semiconductor chips. In a second more particular example, the wire may have a thickness from about 125 micrometer to about 500 micrometer. Such wire may be particularly employed to provide an electrical connection between a contact element and a source electrode of a power semiconductor chip.

Figure 1B:
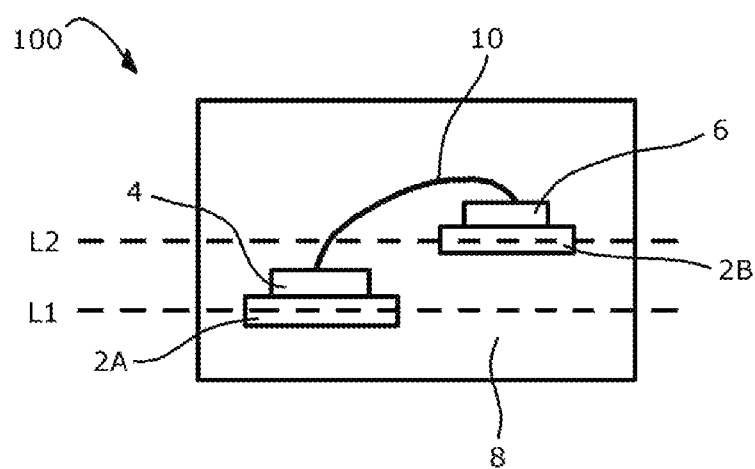
FIG. 1B schematically illustrates a cross-sectional side view of the device 100.

FIGS. 1A and 1B schematically illustrate views of a device 100 in accordance with the disclosure. In particular, FIG. 1A illustrates a top view of the device 100, and FIG. 1B illustrates a cross-sectional side view of the device 100. Due to the chosen perspectives, FIG. 1A may show components that are not shown by FIG. 1B and vice versa. In the example of FIGS. 1A and 1B, the device 100 is illustrated in a general manner and may include further components that are not illustrated for the sake of simplicity. For example, the device 100 may further include one or more components of other devices in accordance with the disclosure. A more detailed device similar to the device 100 is e.g. described in connection with FIGS. 4A and 4B.

The device 100 may include a carrier that may include a first carrier section 2A on a first level L1 and a second carrier section 2B on a second level L2 different from the first level L1. In one example, the first carrier section 2A and the second carrier section 2B may correspond to a diepad, respectively. An exemplary distance between the first level L1 and the second level L2 may lie in a range from about 0.5 millimeter to about 5.0 millimeter. The device 100 may further include a compound semiconductor chip 4 that may be arranged over the first carrier section 2A. In one example, the compound semiconductor chip may be a GaN-based power HEMT. In addition, the device 100 may include a control semiconductor chip 6 that may be arranged over the second carrier section 2B and configured to control the compound semiconductor chip 4. In one example, the control semiconductor chip 6 may correspond to a gate driver that may be configured to drive a gate electrode of a power HEMT. The device 100 may further include an encapsulation material 8 that may cover the compound semiconductor chip 4 and the control semiconductor chip 6. In one example, the device 100 may operate as a switch of a half bridge circuit.

During an operation of the device 100, undesired parasitic effects may occur. The control semiconductor chip 6 may be electrically connected to the compound semiconductor chip 4 by an electrically conductive coupling element 10 for control purposes. In general, the coupling element 10 may be arbitrary and may e.g. include at least one of a wire and a clip. In a more specific example, the coupling element 10 may include one or more wires electrically connecting a gate driver and a gate electrode of a power HEMT. Such wire(s) may e.g. be made of or may include at least one of Al, Au, Cu, etc. A thickness of such wire(s) may e.g. lie in a range from about 20 micrometer to about 500 micrometer. In addition, a length of such wire(s) may e.g. lie in a range from about 1 millimeter to about 10 millimeter. Typical currents passing through such wire(s) may e.g. lie in a range from about 0.1 A to about 10 A. For example, a current in the coupling element 10 may induce a parasitic like inductance L. For an example of a power HEMT chip based on GaN and driven by a driver circuit, a value of the inductance L may be much greater than 2 nH, i.e. L$\gg$2 nH. Such inductance value may e.g. have an undesired effect on a switching performance of a half bridge including the power HEMT and the driver circuit. In particular, the value of the inductance L may increase with an increasing length of the coupling element 10. In the example of FIGS. 1A and 1B, the semiconductor chips 4 and 6 are arranged in the same encapsulation material 8. In addition, the semiconductor chips 4 and 6 are arranged over carrier section 2A, 2B of the same carrier. The chosen arrangement may thus particularly reduce a length of the coupling element 10 and therefore a value of the parasitic inductance L. In addition, the chosen arrangement may result in a compact design of the device 100.

Figure 2A:
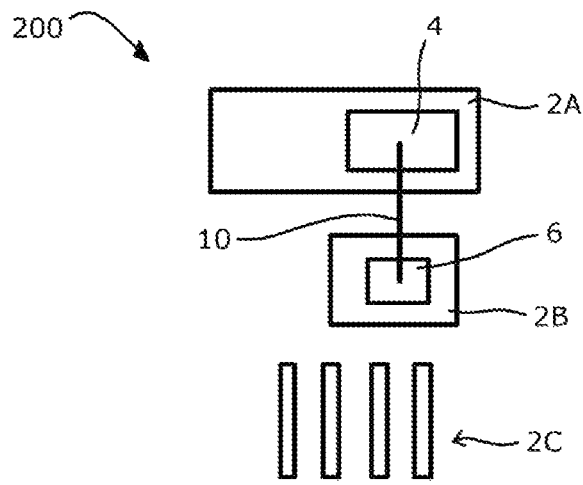
FIG. 2A schematically illustrates a top view of a device 200 in accordance with the disclosure.
Figure 2B:
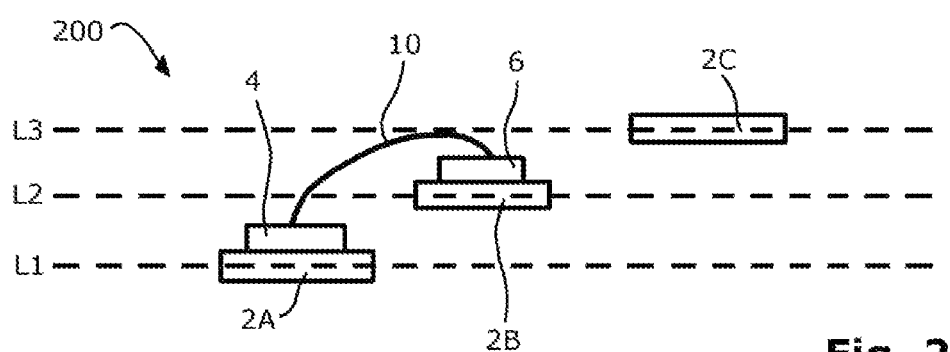
FIG. 2B schematically illustrates a cross-sectional side view of the device 200.

FIGS. 2A and 2B schematically illustrate views of a device 200 in accordance with the disclosure. In particular, FIG. 2A illustrates a top view of the device 200, and FIG. 2B illustrates a cross-sectional side view of the device 200. Due to the chosen perspectives, FIG. 2A may show components that are not shown by FIG. 2B and vice versa. In the example of FIGS. 2A and 2B, the device 200 is illustrated in a general manner and may include further components that are not illustrated for the sake of simplicity. For example, the device 200 may further include one or more components of other devices in accordance with the disclosure. A more detailed device similar to the device 200 is e.g. described in connection with FIGS. 4A and 4B.

The device 200 may include a leadframe including a first diepad 2A on a first level L1, a second diepad 2B on a second level L2, and a plurality of leads 2C on a third level L3. The levels L1, L2, L3 may differ from each other. An exemplary distance between two adjacent levels, for example between the first level L1 and the second level L2, may lie in a range from about 0.5 millimeter to about 5.0 millimeter. The device 200 may further include a compound semiconductor chip 4 that may be arranged over the first diepad 2A and a control semiconductor chip 6 that may be arranged over the second diepad 2B, wherein the control semiconductor chip 6 may be configured to control the compound semiconductor chip 4. The semiconductor chips 4 and 6 may be similar to the corresponding components of FIGS. 1A and 1B. The plurality of leads 2C may be electrically coupled to at least one of the compound semiconductor chip 4 and the control semiconductor chip 6. The device 200 may be similar to the device 100 such that comments made in connection with the device 100 may also hold true for the device 200.

Figure 3A:
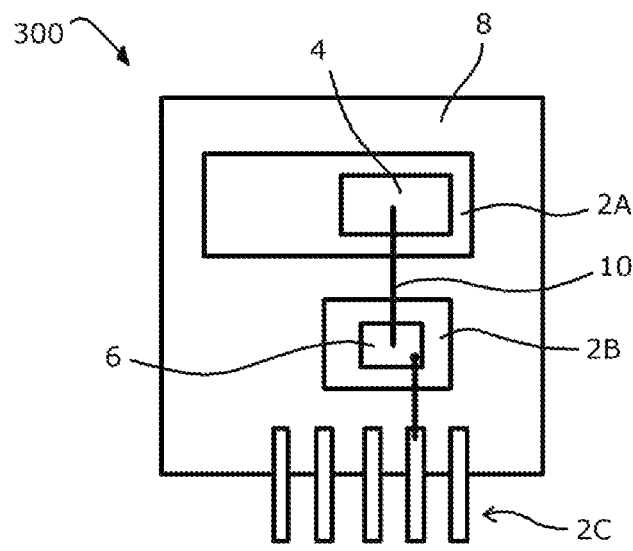
FIG. 3A schematically illustrates a top view of a device 300 in accordance with the disclosure.
Figure 3B:
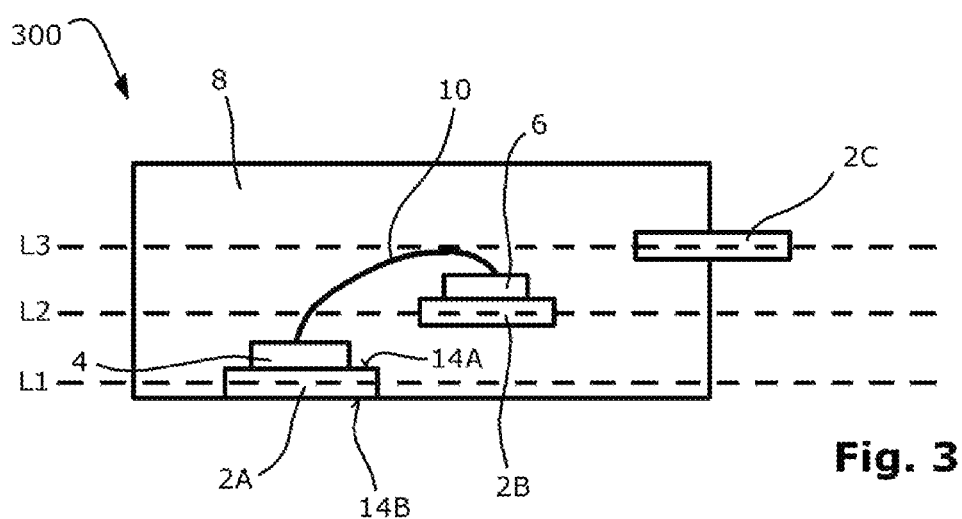
FIG. 3B schematically illustrates a cross-sectional side view of the device 300.

FIGS. 3A and 3B schematically illustrate views of a device 300 in accordance with the disclosure. In particular, FIG. 3A illustrates a top view of the device 300, and FIG. 3B illustrates a cross-sectional side view of the device 300. Due to the chosen perspectives, FIG. 3A may show components that are not shown by FIG. 3B and vice versa. In the example of FIGS. 3A and 3B, the device 300 is illustrated in a general manner and may include further components that are not illustrated for the sake of simplicity. For example, the device 300 may further include one or more components of other devices in accordance with the disclosure. A more detailed device similar to the device 300 is e.g. described in connection with FIGS. 4A and 4B.

The device 300 may include a carrier comprising a first carrier section 2A on a first level L1 and a second carrier section 2B on a second level L2 different from the first level L1. For example, the carrier sections 2A, 2B may be similar to the corresponding carrier sections of FIG. 1. The device 300 may further include a compound semiconductor chip 4 that may be arranged over a first surface 14A of the first carrier section 2A, and a control semiconductor chip 6 that may be arranged over the second carrier section 2B and may be configured to control the compound semiconductor chip 4. For example, the semiconductor chips 4, 6 may be similar to corresponding semiconductor chips of foregoing figures. The device 300 may further include an encapsulation material 8 that may cover the compound semiconductor chip 4 and the control semiconductor chip 6. A second surface 14B of the first carrier section 2A opposite the first surface 14A may be exposed from the encapsulation material 8. The device 300 may further include a plurality of leads 2C that may be electrically coupled to at least one of the compound semiconductor chip 4 and the control semiconductor chip 6. The plurality of leads 2C may protrude out of the encapsulation material 8. In addition, the plurality of leads 2C may be arranged on at least one of the second level L2 and a third level L3 that may differ from the first level L1 and the second level L2. In the non-limiting example of FIG. 3, the level L3 is chosen to differ from the levels L1 and L2. A distance between e.g. the third level L3 and the second level L2 may lie in a range from about 0.5 millimeter to about 5 millimeter. The device 300 may be similar to the devices 100 and 200 such that comments made in connection with FIGS. 1 and 2 may also hold true for FIG. 3.

Figure 4A:
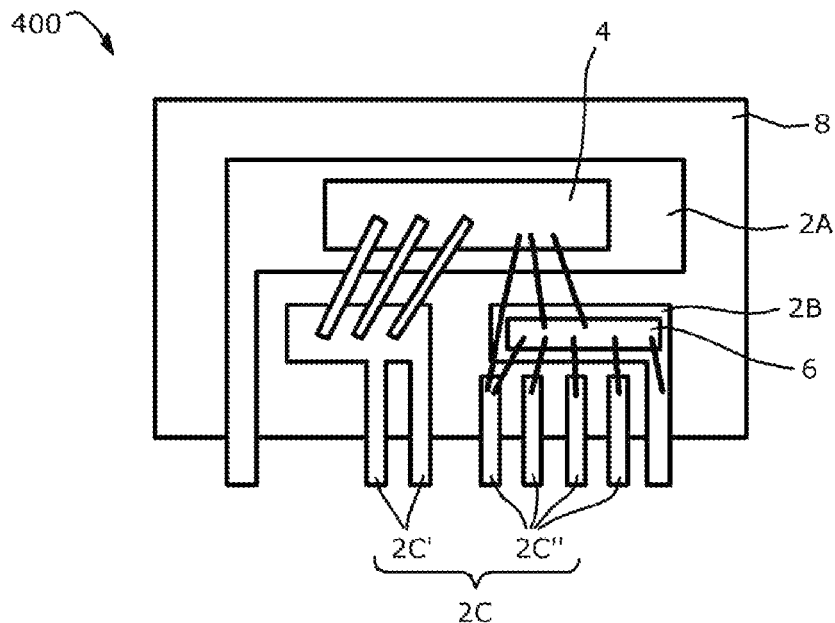
FIG. 4A schematically illustrates a top view of a device 400 in accordance with the disclosure.
Figure 4B:
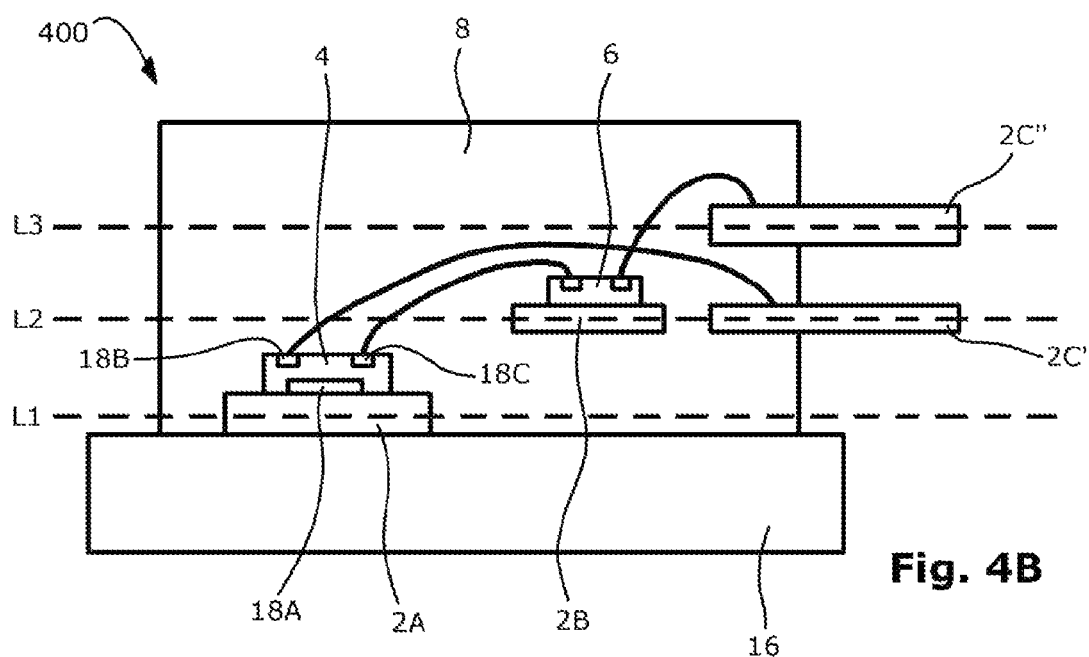
FIG. 4B schematically illustrates a cross-sectional side view of the device 400.

FIGS. 4A and 4B schematically illustrate views of a device 400 in accordance with the disclosure. In particular, FIG. 4A illustrates a top view of the device 400, and FIG. 4B illustrates a cross-sectional side view of the device 400. Due to the chosen perspectives, FIG. 4A may show components that are not shown by FIG. 4B and vice versa. The device 400 may be seen as a more detailed implementation of the devices 100 to 300 such that details of the device 400 described below may be likewise applied to the devices 100 to 300.

The device 400 may include a compound semiconductor chip 4 that may be mounted on a first diepad 2A, a control semiconductor chip 6 that may be mounted on a second diepad 2B, and a plurality of leads 2C. The device 400 may further include electrically conductive coupling elements that may be configured to electrically couple components of the device 400 as illustrated in FIGS. 4A and 4B. For example, the coupling elements may correspond to wires and/or clips. In the example of FIGS. 4A and 4B, the coupling elements are illustrated by solid lines and elongated rectangles. The solid lines may e.g. represent wires, and the elongated rectangles may e.g. represent wires with an increased diameter. The device 400 may further include an encapsulation material 8 and a heatsink 16. The heatsink 16 may be regarded as a part of the device 400 or not.

The diepads 2A, 2B and the plurality of leads 2C may be arranged on different levels L1 to L3 as it has been described in connection with foregoing figures. In the example of FIGS. 4A and 4B, the plurality of leads 2C may be arranged on the second level L2 and the third level L3. In further examples, the plurality of leads 2C may be exclusively arranged on the second level L2 or may be exclusively arranged on the third level L3. For example, the diepads 2A, 2B and the plurality of leads 2C may be part of the same leadframe. In this case, the diepads 2A, 2B and the leads 2C may have been formed before or after the leadframe may have been bent in a suitable manner such that the diepads and the leads were moved to the corresponding levels L1 to L3. The level L1 including the first diepad 2A may be referred to as diepad level, the level L2 including the second diepad 2B and a part of the plurality of leads 2C that may be bonded to wires may be referred to as diepad and wirebond level, and the third level L3 including a part of the plurality of leads 2C that may be bonded to wires may be referred to as wirebond level.

The first diepad 2A may be at least partly embedded in the encapsulation material 8. In the example of FIGS. 4A and 4B, the first diepad 2A may be exposed from the encapsulation material 8 on its lower surface. In particular, the exposed lower surface of the first diepad 2A and the lower surface of the encapsulation material 8 may be flush, i.e. the surfaces may be arranged in a common plane. Due to the flush arrangement of the surfaces, the lower surface of the first diepad 2A may contact the heatsink 16, in particular in a common plane. In one example, the first diepad 2A may be in direct contact with the heatsink 16. In a further example, additional layers, such as e.g. thermal grease, may be arranged between the first diepad 2A and the heatsink 16. A heat dissipation path may extend from an electronic component arranged over the first diepad 2A to the heatsink 16 in a direction substantially perpendicular to a mounting surface of the first diepad 2A. The first diepad 2A may include an enlarged surface for mounting one or more electronic components, for example a semiconductor chip. In addition, the first diepad 2A may include an elongated section that may have the form of a lead or pin. The lead may protrude out of the encapsulation material 8 such that an electrical coupling between an electronic component mounted on the first diepad 2A and an external component may be established.

The second diepad 2B may be at least partly embedded in the encapsulation material 8. In one example, each surface of the second diepad 2B may be covered by the encapsulation material 8. In particular, the lower surface of the second diepad 2B may be covered by the encapsulation material 8 such that the second diepad 2B may be electrically insulated from the heatsink 16, thereby avoiding undesired electrical short circuits. The second diepad 2B may include an enlarged surface for mounting one or more electronic components, for example a semiconductor chip. In addition, the second diepad 2B may include an elongated section that may have the form of a lead or pin. The lead may protrude out of the encapsulation material 8 such that an electrical coupling between an electronic component mounted on the second diepad 2B and an external component may be established.

The plurality of leads 2C may include multiple sections that may be arranged on at least one of the second level L2 and the third level L3. The plurality of leads 2C may at least partly protrude out of the encapsulation material 8, thereby providing an electrical coupling between electronic components embedded in the encapsulation material 8 and external components. In the example of FIGS. 4A and 4B, the plurality of leads 2C may include a first section 2C' and a second section 2C".

The first section 2C' may e.g. be arranged on the second level L2 and may include an enlarged section that may be configured to provide additional space for coupling electrically conductive coupling elements thereto. For example, the enlarged section may be used for wirebonding purposes. In addition, the first section 2C' may include two leads that may protrude out of the encapsulation material 8. In further examples, the number of leads of the first section 2C' may be increased or reduced depending on the considered application.

The second section 2C" may be arranged on the third level L3 and may include one or more leads or pins that may protrude out of the encapsulation material 8, thereby providing an electrical connection between the inside and outside of the encapsulation material 8. In the example of FIGS. 4A and 4B, the second section 2C" may include four leads. In further examples, the number of leads of the second section 2C" may be increased or reduced depending on the considered application. The chosen arrangement of the first section 2C' and the second section 2C" may result in different lead pitches of the device 500.

The leads of the first diepad 2A, the leads of the second diepad 2B and the plurality of leads 2C may protrude out of a same surface of the encapsulation material 8. In addition, the leads may be arranged in parallel such that the device 400 may e.g. be arranged over a printed circuit board (PCB) as e.g. illustrated in FIG. 6.

The compound semiconductor chip 4 may be based on a compound semiconductor material, for example gallium nitride. In the example of FIGS. 4A and 4B, the compound semiconductor chip 4 may correspond to a power HEMT chip that may include a drain electrode 18A on a first main surface facing the first diepad 2A, as well as a source electrode 18B and a gate electrode 18C on a second surface facing away from the first diepad 2A. The compound semiconductor chip 4 may thus have a vertical structure. The drain electrode 18A may be electrically connected to the first diepad 2A such that the lead of the first diepad 2A protruding out of the encapsulation material 8 may provide an electrical connection between the drain electrode 18A and external components. The source electrode 18B may be electrically connected to the first section 2C' of the plurality of leads 2C such that an electrical connection between the source electrode 18B and external components may be established.

In the example of FIGS. 4A and 4B, the control semiconductor chip 6 may e.g. correspond to a gate driver circuit. The gate driver 6 may include one or more electrical contacts arranged over a main surface facing away from the second diepad 2B. One or more of the electrical contacts may be electrically connected to the gate electrode 18C of the compound semiconductor chip 4, for example via one or more wires. In addition, one or more of the electrical contacts of the gate driver 6 may be electrically connected to one or more of the leads of at least one of the second diepad 2B and the second section 2C" of the plurality of leads 2C. This way, an electrical connection between the gate driver 6 and external components arranged outside of the encapsulation material 8 may be established. In one example, the gate driver 6 may e.g. be connected to an external pulse width modulator.

Figure 7:
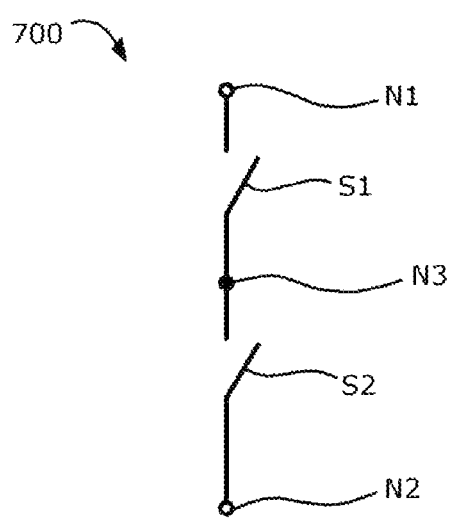
FIG. 7 illustrates a schematic diagram of a half bridge circuit 700.

In one example, the compound power HEMT 4 and the gate driver 6 of the device 400 may form a switch of a half bridge circuit as described in FIG. 7. It is understood that the device 400 may include further electronic components that are not illustrated for the sake of simplicity. In one example, the device 400 may include an additional compound power HEMT and an additional gate driver which may form a second switch of the half bridge circuit. In particular, additional components may also be at least partly covered by the encapsulation material 8. In other words, the additional components may be a part of the same semiconductor package.

Figure 5A:
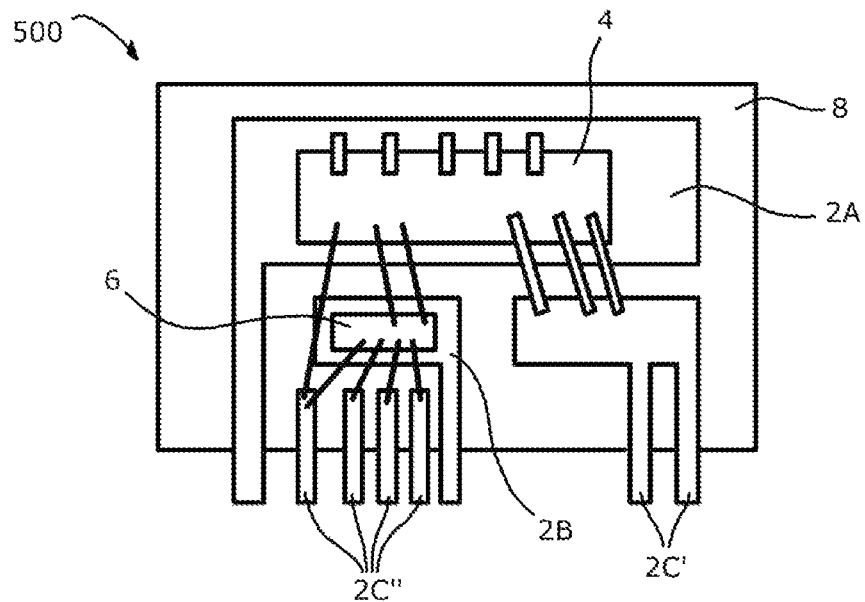
FIG. 5A schematically illustrates a top view of a device 500 in accordance with the disclosure.
Figure 5B:
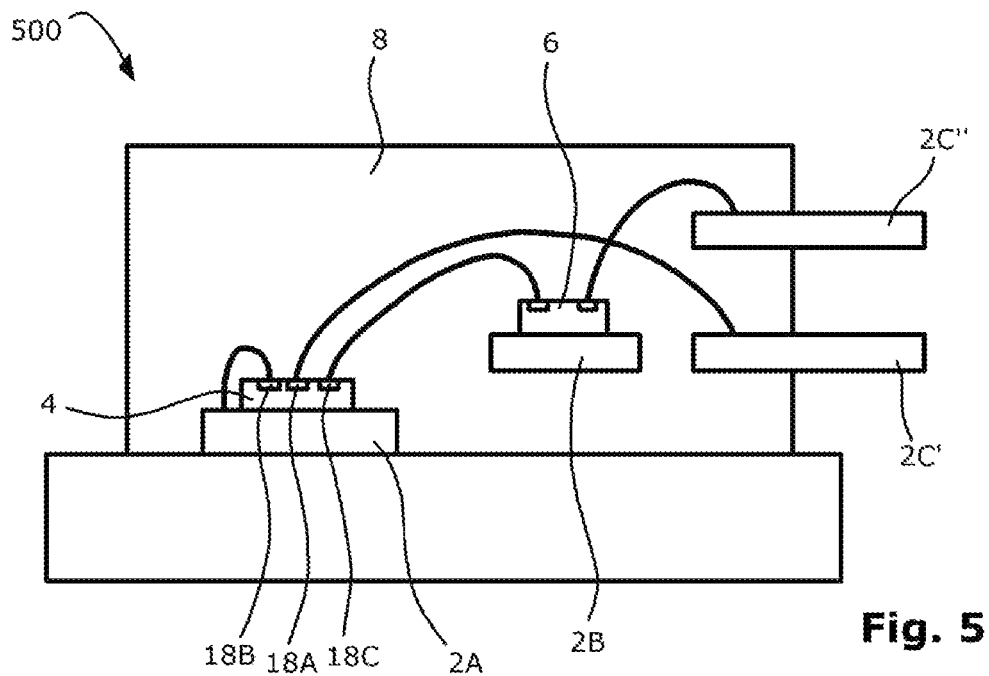
FIG. 5B schematically illustrates a cross-sectional side view of the device 500.

FIGS. 5A and 5B schematically illustrate views of a device 500 in accordance with the disclosure. In particular, FIG. 5A illustrates a top view of the device 500, and FIG. 5B illustrates a cross-sectional side view of the device 500. Due to the chosen perspectives, FIG. 5A may show components that are not shown by FIG. 5B and vice versa. The device 500 may be seen as a more detailed implementation of the devices 100 to 300 such that details of the device 500 may be likewise applied to the devices 100 to 300. In addition, the device 500 may be at least partly similar to the device 400.

The devices 400 and 500 may represent an identical circuitry. In contrast to the device 400, the compound semiconductor chip 4 of the device 500 may have a lateral structure, wherein the drain electrode 18A, the source electrode 18B and the gate electrode 18C may be arranged on a same surface facing away from the first diepad 2A. In addition, the source electrode 18B of the power HEMT 4 may be electrically coupled to the first diepad 2A, and the drain electrode 18A of the power HEMT 4 may be electrically coupled to a first section 2C' of the plurality of leads 2C. Similar to the device 400, the chosen arrangement of the first section 2C' and the second section 2C" may result in different lead pitches of the device 500.

Figure 6:
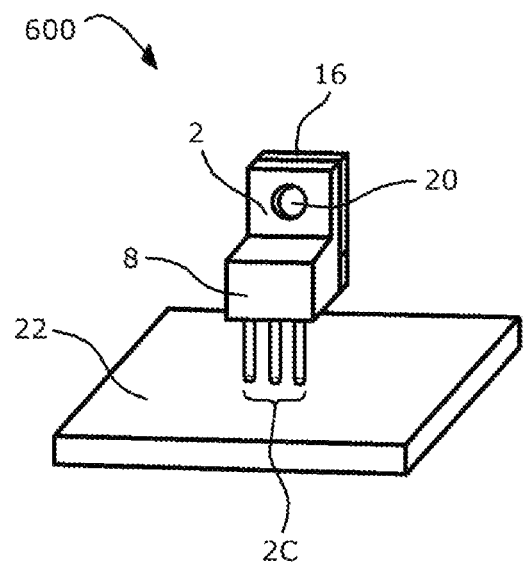
FIG. 6 schematically illustrates a perspective view of a device 600 in accordance with the disclosure.

FIG. 6 schematically illustrates a perspective view of a device 600 in accordance with the disclosure. For example, the device 600 may at least partly be similar to one of the previously described devices in accordance with the disclosure. The device 600 may include a semiconductor package that may include various electronic components, for example a compound semiconductor chip and a control semiconductor chip as previously described. In FIG. 6, the electronic components of the device 600 are covered by an encapsulation material 8 and are thus not visible. The electronic components may be arranged over a carrier 2 that may include multiple carrier sections. The carrier 2 may at least partly be covered by the encapsulation material 8. In the example of FIG. 6, a part of the carrier 2 may protrude out of the encapsulation material 8. The protruding part of the carrier 2 may include a hole 20 that may extend through the carrier 2. In a further example, the part of the carrier 2 including the hole 20 may be covered by the encapsulation material 8 as well, wherein the hole 20 may then also extend through the encapsulation material 8. A heatsink 16 may be attached to the rear surface of the semiconductor package, in particular to an exposed surface of the carrier 2, for example by means of a screw (not illustrated). The heatsink 16 may be seen as a part of the device 600 or not. In addition, a plurality of leads 2C may protrude out of the encapsulation material 8. The plurality of leads 2C may also include leads connected to diepads of the semiconductor package. The plurality of leads 2C may be configured to provide an electrical connection to internal components of the device 600. The semiconductor package may be mounted on a printed circuit board (PCB) 22. The PCB 22 may provide an electrical connection between the semiconductor package 600 and further electronic components that may also be mounted on the PCB. The PCB 22 may be regarded as a part of the device 600 or not.

FIG. 7 illustrates a schematic diagram of a half bridge circuit 700. The half bridge circuit 700 may be arranged between nodes N1 and N2. The half bridge circuit 700 may include switches S1 and S2 connected in series. Constant electrical potentials may be applied to the nodes N1 and N2. For example, a high potential, such as 10, 12, 18, 50, 110, 230, 500 or 1000 V or any other potential, may be applied to the node N1 and a low electrical potential, for example 0 V, may be applied to the node N2. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit 700 may e.g. be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

The devices in accordance with the disclosure may be configured to operate as a half bridge circuit or at least a part of it. For example, the device 400 of FIG. 4 may be configured to operate as a switch of a half bridge circuit. In a similar fashion, a device in accordance with the disclosure may be configured to operate as at least a part of any other bridge circuit or a cascode circuit.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof.

What is claimed is:

1. A device, comprising:
    a carrier comprising a first carrier section on a first level and a second carrier section on a second level different from the first level in a vertical direction, the first carrier section and the second carrier section being offset from one another in a horizontal direction so that the second carrier section does not cover the first carrier section;
    a compound semiconductor chip arranged over the first carrier section;
    a control semiconductor chip arranged over the second carrier section and configured to control the compound semiconductor chip;
    an encapsulation material covering the compound semiconductor chip and the control semiconductor chip; and
    an electrically conductive coupling element directly connecting an electrical contact arranged on a main surface of the control semiconductor chip facing away from the second carrier section to a gate electrode arranged on a main surface of the compound semiconductor chip facing away from the first carrier section.

2. The device of claim 1, wherein the compound semiconductor chip is arranged over a first surface of the first carrier section, wherein a second surface of the first carrier section opposite the first surface is exposed from the encapsulation material, wherein the control semiconductor chip is arranged over a first surface of the second carrier section, and wherein a second surface of the second carrier section opposite the first surface is covered by the encapsulation material.

3. The device of claim 2, wherein the second surface of the first carrier section is configured to be coupled to a heatsink, and wherein a heat dissipation path extends from the compound semiconductor chip to the heatsink in a direction perpendicular to the second surface of the first carrier section.

4. The device of claim 2, wherein a surface of the encapsulation material and the second surface of the first carrier section are flush.

5. The device of claim 1, further comprising a plurality of leads protruding out of the encapsulation material, wherein the plurality of leads is arranged on at least one of the second level and a third level different from the first level and the second level.

6. The device of claim 5, further comprising a semiconductor chip arranged over the plurality of leads.

7. The device of claim 5, wherein the first carrier section comprises a first lead protruding out of the encapsulation material, wherein the second carrier section comprises a second lead protruding out of the encapsulation material, and wherein the first lead, the second lead and the plurality of leads comprise at least two different lead pitches.

8. The device of claim 5, wherein the control semiconductor chip is electrically coupled to the plurality of leads.

9. The device of claim 5, wherein the plurality of leads protrudes out of a surface of the encapsulation material, wherein the surface is perpendicular to a mounting surface of the first carrier section.

10. The device of claim 5, wherein the leads are parallel to each other and extend in a direction perpendicular to a heat dissipation path extending from the compound semiconductor chip to a heatsink.

11. The device of claim 5, wherein the first carrier section, the second carrier section and the plurality of leads are part of a same leadframe.

12. The device of claim 5, wherein the compound semiconductor chip comprises a power HEMT, wherein a drain electrode of the power HEMT is electrically coupled to the first carrier section, and wherein a source electrode of the power HEMT is electrically coupled to the plurality of leads.

13. The device of claim 1, wherein a distance between the first level and the second level in the vertical direction is in a range between 0.5 millimeters and 5.0 millimeters.

14. The device of claim 1, wherein the carrier comprises a hole extending through the carrier.

15. The device of claim 1, wherein the compound semiconductor chip comprises a power HEMT, and wherein the control semiconductor chip comprises a gate driver circuit configured to drive the gate electrode of the power HEMT through the electrically conductive coupling element.

16. The device of claim 1, wherein the compound semiconductor chip comprises a GaN-based power HEMT.

17. A device, comprising:
a leadframe comprising a first diepad on a first level, a second diepad on a second level,
and a plurality of leads on a third level, wherein the three levels differ from each other in a vertical direction, wherein the first diepad and the second diepad are offset from one another in a horizontal direction so that the second diepad does not cover the first diepad;
a compound semiconductor chip arranged over the first diepad;
a control semiconductor chip arranged over the second diepad and configured to control the compound semiconductor chip; and
an electrically conductive coupling element directly connecting an electrical contact arranged on a main surface of the control semiconductor chip facing away from the second diepad to a gate electrode arranged on a main surface of the compound semiconductor chip facing away from the first diepad,
wherein the plurality of leads is electrically coupled to at least one of the compound semiconductor chip and the control semiconductor chip.

18. The device of claim 17, further comprising an encapsulation material covering the compound semiconductor chip and the control semiconductor chip.

19. A device, comprising:
a carrier comprising a first carrier section on a first level and a second carrier section on a second level different from the first level in a vertical direction, the first carrier section and the second carrier section being offset from one another in a horizontal direction so that the second carrier section does not cover the first carrier section;
a compound semiconductor chip arranged over a first surface of the first carrier section;
a control semiconductor chip arranged over the second carrier section and configured to control the compound semiconductor chip;
an electrically conductive coupling element directly connecting an electrical contact arranged on a main surface of the control semiconductor chip facing away from the second carrier section to a gate electrode arranged on a main surface of the compound semiconductor chip facing away from the first carrier section;
an encapsulation material covering the compound semiconductor chip and the control semiconductor chip, wherein a second surface of the first carrier section opposite the first surface is exposed from the encapsulation material; and
a plurality of leads electrically coupled to at least one of the control semiconductor chip and the compound semiconductor chip, wherein the plurality of leads protrudes out of the encapsulation material, and the plurality of leads is arranged on at least one of the second level and a third level different from the first level and the second level.

* * * * *